(12) United States Patent
Lin et al.

(10) Patent No.: US 11,411,650 B2
(45) Date of Patent: Aug. 9, 2022

(54) COMPONENT BRIDGE FOR INCREASING MOUNTING SURFACE AREA ON FEEDTHROUGH DEVICE AND AN OPTICAL SUBASSEMBLY IMPLEMENTING SAME

(71) Applicant: Applied Optoelectronics, Inc., Sugar Land, TX (US)

(72) Inventors: Kai-Sheng Lin, Sugar Land, TX (US); Kevin Liu, Houston, TX (US); Hao-Chiang Cheng, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 16/751,817

(22) Filed: Jan. 24, 2020

(65) Prior Publication Data
US 2021/0234612 A1    Jul. 29, 2021

(51) Int. Cl.
| | |
|---|---|
| *H04B 10/00* | (2013.01) |
| *H04B 10/40* | (2013.01) |
| *G02B 6/42* | (2006.01) |
| *H05K 1/02* | (2006.01) |
| *H05K 1/18* | (2006.01) |
| *H04B 10/66* | (2013.01) |
| *H04B 10/50* | (2013.01) |

(52) U.S. Cl.
CPC .......... *H04B 10/40* (2013.01); *G02B 6/4246* (2013.01); *G02B 6/4279* (2013.01); *H04B 10/50* (2013.01); *H04B 10/66* (2013.01); *H05K 1/0237* (2013.01); *H05K 1/181* (2013.01); *H05K 2201/10015* (2013.01); *H05K 2201/10121* (2013.01); *H05K 2201/10272* (2013.01); *H05K 2201/10287* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,295,214 A | * | 3/1994 | Card ..................... | G02B 6/4274 385/92 |
| 5,604,831 A | * | 2/1997 | Dittman ............... | B23K 35/268 385/88 |

(Continued)

*Primary Examiner* — Agustin Bello
(74) *Attorney, Agent, or Firm* — Grossman Tucker Perreault & Pfleger, PLLC; Norman S. Kinsella

(57) ABSTRACT

The present disclosure is generally directed to a component bridge that couples to a feedthrough device to provide additional component mounting surface area within a TOSA housing, and preferably, within a hermetically-sealed TOSA housing. The component bridge includes a body that defines a component mounting surface to couple to electrical components, e.g., one or more filtering capacitors, and a notched portion to provide an accommodation groove. The component bridge includes at least one projection/leg for coupling to a mounting surface of a feedthrough device. The accommodation groove of the component bridge allows for other electrical components, e.g., RF traces, to be patterned/disposed on to the mounting surface and extend at least partially through the accommodation groove while remaining electrically isolated from the same. Accordingly, the component bridge further increases available component mounting surface area for existing feedthrough devices without necessity of re-design and/or modification.

15 Claims, 4 Drawing Sheets

(56) References Cited

U.S. PATENT DOCUMENTS

| | | | | |
|---|---|---|---|---|
| 5,659,459 | A * | 8/1997 | Wakabayashi | B41J 29/377 174/51 |
| 5,699,235 | A * | 12/1997 | Tsurumiya | H05K 1/0265 361/736 |
| 6,163,460 | A * | 12/2000 | Baur | H01G 2/04 361/752 |
| 6,276,943 | B1 * | 8/2001 | Boutros | H01R 13/6658 439/76.1 |
| 6,583,902 | B1 * | 6/2003 | Yuen | G02B 6/4292 398/135 |
| 7,273,381 | B2 * | 9/2007 | Ito | H01R 12/58 439/79 |
| RE40,150 | E * | 3/2008 | Ishibashi | G02B 6/4246 361/785 |
| 9,843,394 | B2 * | 12/2017 | Xiao | G02B 6/2938 |
| 9,995,892 | B2 * | 6/2018 | Xu | G02B 6/34 |
| 10,516,487 | B1 * | 12/2019 | Kang | H04B 10/516 |
| 10,648,650 | B1 * | 5/2020 | Tran | F21V 17/12 |
| 2002/0034088 | A1 * | 3/2002 | Parkhill | H05K 1/0231 363/144 |
| 2003/0118293 | A1 * | 6/2003 | Canace | G02B 6/4246 385/92 |
| 2004/0069997 | A1 * | 4/2004 | Dair | G02B 6/4214 257/81 |
| 2004/0086240 | A1 * | 5/2004 | Togami | G02B 6/4246 385/92 |
| 2004/0126118 | A1 * | 7/2004 | Lo | G02B 6/4206 398/139 |
| 2005/0117854 | A1 * | 6/2005 | Chiu | G02B 6/3897 385/92 |
| 2005/0152701 | A1 * | 7/2005 | Liu | H05K 9/0058 398/135 |
| 2006/0228079 | A1 * | 10/2006 | Tamanuki | H01R 13/514 385/92 |
| 2007/0189677 | A1 * | 8/2007 | Murry | G02B 6/4201 385/92 |
| 2007/0207670 | A1 * | 9/2007 | Stewart | H01R 13/6595 439/607.01 |
| 2008/0291653 | A1 * | 11/2008 | Sailor | H01G 2/04 361/807 |
| 2012/0099816 | A1 * | 4/2012 | Wilson | H01S 5/02251 385/33 |
| 2012/0148201 | A1 * | 6/2012 | Kondou | G02B 6/4257 385/92 |
| 2012/0213527 | A1 * | 8/2012 | Duijn | G02B 6/4246 398/139 |
| 2013/0071072 | A1 * | 3/2013 | Xie | G02B 6/4277 385/92 |
| 2013/0136458 | A1 * | 5/2013 | Kawase | H05K 9/0058 398/135 |
| 2013/0148977 | A1 * | 6/2013 | Shah | H04B 10/40 398/135 |
| 2014/0286636 | A1 * | 9/2014 | Jiang | G02B 6/4246 398/45 |
| 2015/0256261 | A1 * | 9/2015 | Ho | H04J 14/0246 398/139 |
| 2015/0318952 | A1 * | 11/2015 | Butrie | H04B 10/40 398/65 |
| 2016/0112137 | A1 * | 4/2016 | Pfnuer | H01S 5/02345 398/183 |
| 2016/0113144 | A1 * | 4/2016 | Ye | H05K 3/3421 361/709 |
| 2016/0238805 | A1 * | 8/2016 | McColloch | G02B 6/4257 |
| 2017/0131492 | A1 * | 5/2017 | Vallance | G02B 6/4214 |
| 2017/0272169 | A1 * | 9/2017 | Ho | G02B 6/4257 |
| 2018/0062756 | A1 * | 3/2018 | Ho | G02B 6/4249 |
| 2018/0284373 | A1 * | 10/2018 | Lin | G02B 6/4277 |
| 2018/0287705 | A1 * | 10/2018 | Lin | G02B 6/4281 |
| 2020/0336219 | A1 * | 10/2020 | Wang | H04B 10/802 |
| 2021/0072471 | A1 * | 3/2021 | Li | G02B 6/4263 |
| 2021/0234612 | A1 * | 7/2021 | Lin | H05K 1/181 |

* cited by examiner

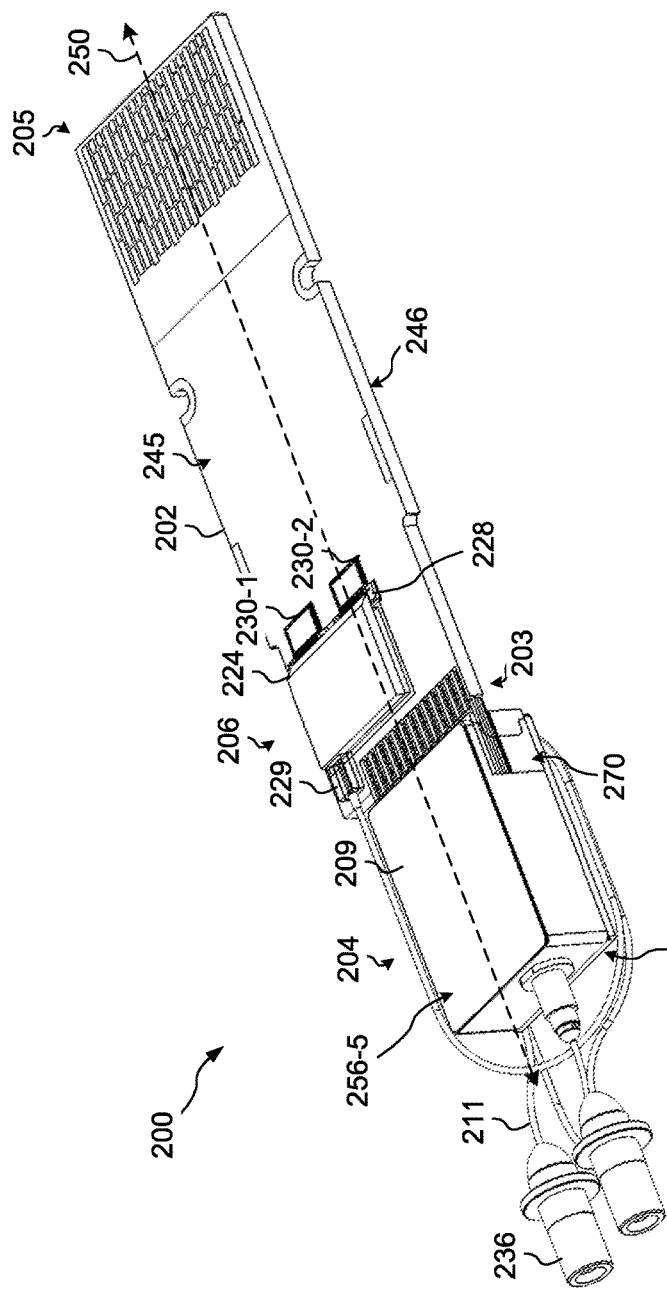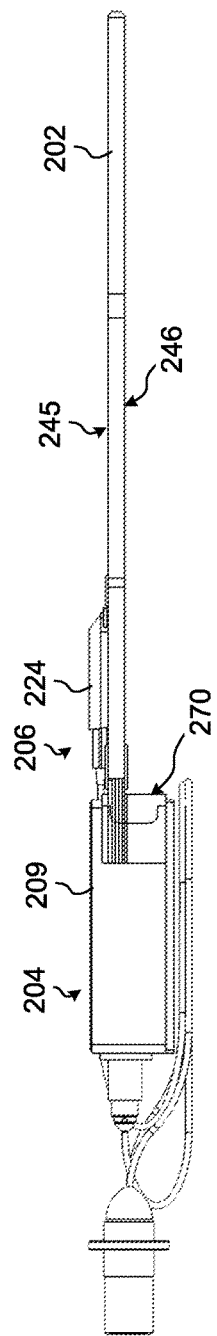

COMPONENT BRIDGE FOR INCREASING MOUNTING SURFACE AREA ON FEEDTHROUGH DEVICE AND AN OPTICAL SUBASSEMBLY IMPLEMENTING SAME

TECHNICAL FIELD

The present disclosure relates to optical communications and more particularly, to a component bridge that mounts to a feedthrough device within a cavity of a transmitter optical subassembly (TOSA) housing to increase overall component mounting surface area.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher transmit/receive speeds in increasingly space-constrained optical transceiver modules has presented challenges, for example, with respect to thermal management, insertion loss, RF driving signal quality and manufacturing yield.

Optical transceiver modules generally include one or more transmitter optical subassemblies (TOSAs) for transmitting optical signals. TOSAs can include one or more lasers to emit one or more channel wavelengths and associated circuitry for driving the lasers. Some optical applications, such as long-distance communication, can require TOSAs to include hermetically-sealed housings with arrayed waveguide gratings, temperature control devices, laser packages and associated circuitry disposed therein to reduce loss and ensure optical performance. However, the inclusion of hermetically-sealed components increases manufacturing complexity, cost, and raises numerous non-trivial challenges within space-constrained housings.

BRIEF DESCRIPTION OF THE DRAWINGS

These and other features and advantages will be better understood by reading the following detailed description, taken together with the drawings wherein:

FIG. 2 is a perspective view of a multi-channel optical transceiver module consistent with the present disclosure.

FIG. 3 is a side view of the multi-channel optical transceiver module of FIG. 2, consistent with an embodiment of the present disclosure.

DETAILED DESCRIPTION

Figure 1:
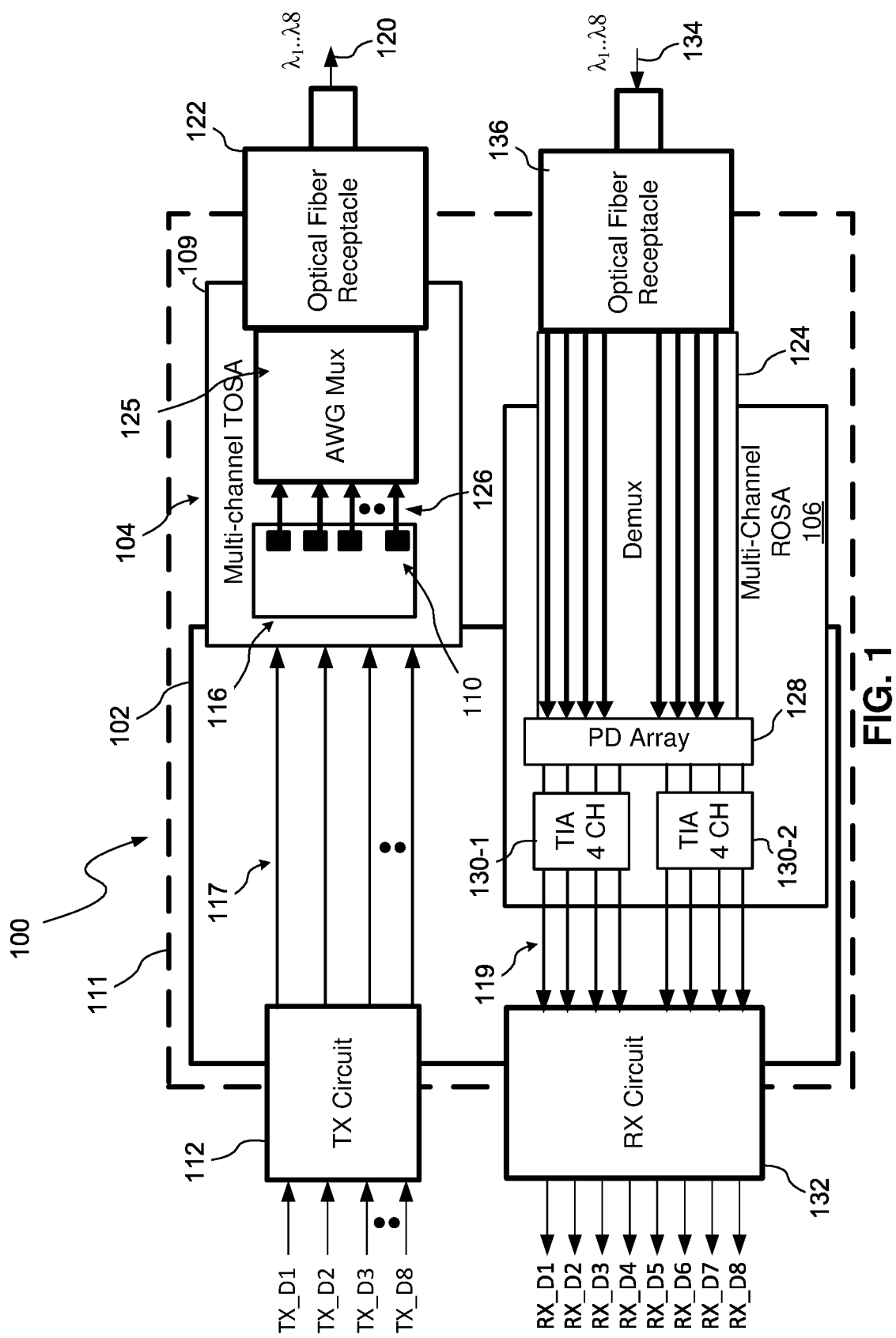
FIG. 1 is a block diagram of a multi-channel optical transceiver, consistent with embodiments of the present disclosure.

As discussed above, significant challenges limit increased channel configurations of optical transceiver modules beyond four (4) channels to achieve transmission speeds in excess of 100 gb/s. One such challenge includes designing transmitter optical subassembly (TOSA) housings with footprints as small as possible while also providing sufficient space to allow for mounting of components and distances between optical components that facilitates thermal dissipation, reduce electrical interference, and maintains radio frequency (RF) driving signal integrity, for example.

These considerations and challenges are of significant import in TOSA designs that utilize hermetically-sealed housings because, among other things, a substantial portion of the overall cost to manufacture each TOSA is directly related to the dimensions/volume of the hermetically-sealed cavity. Some approaches to such TOSA designs include the use of so-called multi-step or multi-tiered feedthrough devices, such as disclosed in U.S. application Ser. No. 16/295,586 entitled "Transmitter Optical Subassembly (TOSA) with Laser Diode Driver (LDD) Circuitry Mounted to Feedthrough of TOSA Housing" filed on Mar. 7, 2019, the teachings of which are incorporated fully herein by reference. Multi-step feedthrough devices significantly increase component density within a TOSA, but are limited to a relatively small number of steps/shoulders due to manufacturing complexity.

Continued scaling of hermetically-sealed TOSA housings, and other similar space-constrained housings, depends at least in part on increasing available component mounting surface area on a feedthrough device without increasing manufacturing complexity.

Thus, the present disclosure is generally directed to a component bridge that couples to a feedthrough device to provide additional component mounting surface area within a TOSA housing, and preferably, within a hermetically-sealed TOSA housing. The component bridge includes a body that defines a component mounting surface to couple to electrical components, e.g., one or more filtering capacitors, and a notched portion to provide an accommodation groove. The component bridge includes at least one projection for coupling to a mounting surface of a feedthrough device, which may also be referred to as a leg or foot. Each foot includes at least one mating surface for coupling to a corresponding mounting surface of a feedthrough device.

The accommodation groove of the component bridge allows for other electrical components, e.g., RF traces, to be patterned/disposed on to the mounting surface and extend at least partially through the accommodation groove while remaining electrically isolated from the same. Accordingly, the component bridge further increases available component mounting surface area for existing feedthrough devices without necessity of re-design and/or modification.

In an embodiment, the body of the component bridge comprises a conductive material, e.g., Copper Tungsten (Cu—W), to allow for electrical coupling with a pad disposed on the mounting surface of the associated feedthrough device. The component bridge can securely couple to the feedthrough device via, for instance, an adhesive.

In the example scenario of mounting filtering capacitors or other electrical components atop the component bridge, the electrical conductivity of the body significantly reduces the overall number of electrical interconnections. A ground or other voltage signal can be applied to the body, and components mounted to the component bridge can electrically couple to the same by simply being mounted with a terminal in (direct) contact with the body of the component bridge.

The body of the component bridge may therefore allow for electrical components mounted atop the same, and more specifically coupled to the component mounting surface of the body, to electrically couple with the feedthrough device. Accordingly, the overall number of electrical interconnections, e.g., wire bonds, get reduced within a TOSA. Reducing the necessity of wire bonds minimizes or otherwise reduces the introduction of signal degradations due to time of flight and impedance matching, as well as the potential for damage through inadvertent contact. Two or more component bridges can be mounted to the same or different tiers/steps of a feedthrough device to further increase component mounting surface area, and yet further reduce the necessity of the above-discussed electrical interconnections.

TOSA designs that utilize component bridges consistent with the present disclosure therefore provide a plurality of benefits and advantageous over other TOSA approaches, and in particular, TOSA approaches that utilize hermetically-sealed housings. Component bridges of the present disclosure advantageously achieve greater component density without necessarily increasing the overall dimensions of hermetically-sealed cavities.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM.

The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals. On the other hand, the term "direct optical coupling" refers to an optical coupling via an optical path between two elements that does not include such intermediate components or devices, e.g., a mirror, waveguide, and so on, or bends/turns along the optical path between two elements.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated/nominal characteristic. To provide one non-limiting numerical example to quantify "substantially," such a modifier is intended to include minor variation that can cause a deviation of up to and including±5% from a particular stated quality/characteristic unless otherwise provided by the present disclosure.

As used herein, the terms hermetic-sealed and hermetically-sealed may be used interchangeably and refer to a housing that releases a maximum of about $5*10^{-8}$cc/sec of filler gas. The filler gas may comprise an inert gas such as nitrogen, helium, argon, krypton, xenon, or various mixtures thereof, including a nitrogen-helium mix, a neon-helium mix, a krypton-helium mix, or a xenon-helium mix.

Referring to the Figures, FIG. 1, an optical transceiver 100, consistent with embodiments of the present disclosure, is shown and described. The optical transceiver module 100 is shown in a highly simplified form for clarity and ease of explanation and not for purposes of limitation. In this embodiment, the optical transceiver 100 includes a multi-channel transmitter optical subassembly (TOSA) arrangement 104 and a multi-channel receiver optical subassembly (ROSA) arrangement 106 coupled to a substrate 102, which may also be referred to as an optical module substrate. The substrate 102 may comprise, for example, a printed circuit board (PCB) or PCB assembly (PCBA). The substrate 102 may be configured to be "pluggable" for insertion into an optical transceiver cage 111.

In the embodiment shown, the optical transceiver 100 transmits and receives eight (8) channels using eight different channel wavelengths ($\lambda 1 \ldots \lambda 8$) via the multi-channel TOSA arrangement 104 and the multi-channel ROSA arrangement 106, respectively, and may be capable of transmission rates of at least about 25 Gbps per channel, and preferably 50 Gbps per channel. The optical transceiver 100 may also be capable of transmission distances of 2 km to at least about 10 km. The optical transceiver 100 may be used, for example, in internet data center applications or fiber to the home (FTTH) applications. Although the following examples and embodiments show and describe a 8-channel optical transceiver, this disclosure is not limited in this regard. For example, the present disclosure is equally applicable to 2, 4,6-channel configurations.

In more detail, the multi-channel TOSA arrangement 104 includes a TOSA housing 109 with a plurality of sidewalls that define a cavity. The cavity includes a plurality of laser arrangements 110, a multiplexing device 125, and a feedthrough device 116 disposed therein. The multi-channel TOSA arrangement 104 may be implemented with one or more component bridges coupled to a feedthrough device to increase component mounting surface area, as will be discussed in further detail below with reference to FIGS. 4A-4C. In any event, each laser arrangement of the plurality of laser arrangements 110 can be configured to transmit optical signals having different associated channel wavelengths. Each laser arrangement can include passive and/or active optical components such as a laser diode (LD), optical isolator, focus lens, monitor photodiode (MPD), and so on.

To drive the plurality of laser arrangements 110, the optical transceiver 100 includes a transmit connecting circuit 112 to provide electrical connections to the plurality of laser arrangements 110 within the housing 109. The transmit connecting circuit 112 may be configured to receive driving signals (e.g., TX_D1 to TX_D8) from, for example, circuitry within the optical transceiver cage 111. The housing 109 may be hermetically sealed to prevent ingress of foreign material, e.g., dust and debris. Therefore, a plurality of transit (TX) traces 117 (or electrically conductive paths) may be patterned on at least one surface of the substrate 102 and electrically coupled to a feedthrough device 116 of the TOSA housing 109 to bring the transmit connecting circuit 112 into electrical communication with the plurality of laser arrangements 110, and thus, electrically interconnect the transmit connecting circuit 112 with the multi-channel TOSA arrangement 104. The feedthrough device 116 may comprise, for instance, ceramic, metal, or any other suitable material.

In operation, the multi-channel TOSA arrangement 104 may then receive driving signals (e.g., TX_D1 to TX_D8), and in response thereto, generate and launch multiplexed channel wavelengths on to an output waveguide 120 such as a transmit optical fiber. The generated multiplexed channel wavelengths may be combined based on a multiplexing device 125 such as an arrayed waveguide grating (AWG) that is configured to receive emitted channel wavelengths 126 from the plurality of laser arrangements 110 and output a signal carrying the multiplexed channel wavelengths on to the output waveguide 120 by way of optical fiber receptacle 122.

Continuing on, the multi-channel ROSA arrangement 106 includes a demultiplexing device 124, e.g., an arrayed waveguide grating (AWG), a photodiode (PD) array 128, and amplification circuitry 130, e.g., a transimpedance amplifier (TIA). An input port of the demultiplexing device 124 may be optically coupled with a receive waveguide 134, e.g., an optical fiber, by way of an optical fiber receptacle 136. An output port of the demultiplexing device 124 may be configured to output separated channel wavelengths on to the PD array 128. The PD array 128 may then output proportional electrical signals to the TIA 130, which then may be amplified and otherwise conditioned. The PD array 128 and the transimpedance amplifier 130 detect and convert optical signals into electrical data signals (RX_D1 to RX_D8) that are output via the receive connecting circuit 132. In operation, the PD array 128 may then output electrical signals carrying a representation of the received channel wavelengths to a receive connecting circuit 132 by way of conductive traces 119 (which may be referred to as conductive paths).

Referring to FIGS. 2-3 an example transceiver module 200 is shown consistent with an embodiment of the present disclosure. The example transceiver module 200 may be implemented as the optical transceiver 100 of FIG. 1. As shown, the optical transceiver module 200 includes a configuration to send and receive eight (8) different channel wavelengths in order to provide transmission speeds up to and an in excess of 400 Gb/s, for instance. However, other channel configurations are within the scope of this disclosure and the embodiment of FIGS. 2-7 are not intended to limit the present disclosure.

In more detail, the optical transceiver module 200 includes a substrate 202, multi-channel TOSA arrangement 204, and a multi-channel ROSA arrangement 206. In particular, the substrate 202 includes a first end 203 that extends to a second end 205 along a longitudinal axis 250.

The substrate 202 includes first and second mounting surface 245, 246 disposed opposite each other. The substrate 202 may comprise, for example, a printed circuit board assembly (PCBA) or other suitable substrate material. The multi-channel ROSA arrangement 206 is coupled to and supported by the first mounting surface 245 at a position proximate the first end 203 of the substrate 202. The multi-channel ROSA arrangement 206 can include on-board/integrated configuration as discussed and described in greater detail in the co-pending U.S. patent application Ser. No. 16/142,466 filed on Sep. 28, 2018 and entitled "Receiver Optical Subassembly (ROSA) Integrated On Printed Circuit Board Assembly," the entirety of which is incorporated herein by reference.

As shown in FIG. 2, the multi-channel ROSA arrangement 206 includes a demultiplexing device 224, e.g., an arrayed waveguide grating (AWG), with an input port 229 coupled to an optical coupling receptacle 236 by way of an intermediate waveguide 211 (e.g., an optical fiber). The demultiplexing device 224 further includes an output region aligned with a photodiode (PD) array 228. The PD array 228 electrically couples to the first and second amplification chips 230-1, 230-2, e.g., transimpedance amplifiers (TIAs). In operation, a multiplexed optical signal received via the optical coupling receptacle 236 gets demultiplexed by the demultiplexing device 224. The demultiplexing device 224 then outputs separated channel wavelengths on to corresponding photodiodes of the PD array 228. In turn, the PD array 228 outputs an electrical current to the amplification circuitry 230-1, 230-2 that is representative of the received and separated channel wavelengths. The amplification circuitry 230-1, 230-2 then amplifies the electrical currents from the PD array 228 and outputs a signal to, for instance, a data bus via the receive connecting circuit 132 (FIG. 1).

The multi-channel TOSA arrangement 204 is coupled to the first end 203 of the substrate 202 and includes a plurality of laser arrangements and optical connectors for outputting a plurality of channel wavelengths, as discussed in greater detail below. The TOSA arrangement 204 may be edge mounted to the substrate 202, as shown, although other suitable approaches are within the scope of this disclosure.

Figure 4A:
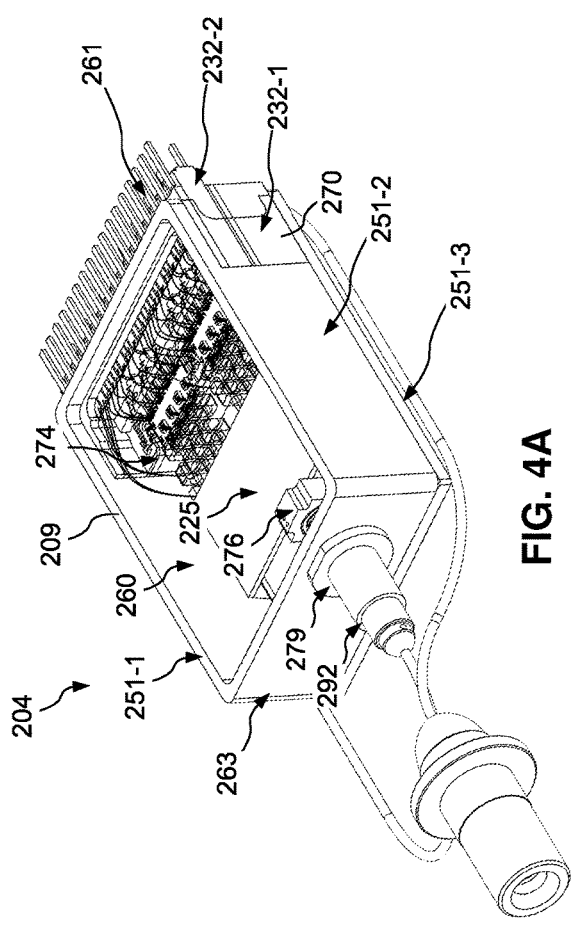
FIG. 4A shows a perspective view of a TOSA module suitable for use with the multi-channel optical transceiver module of FIG. 2, in accordance with an embodiment of the present disclosure.
Figure 4B:
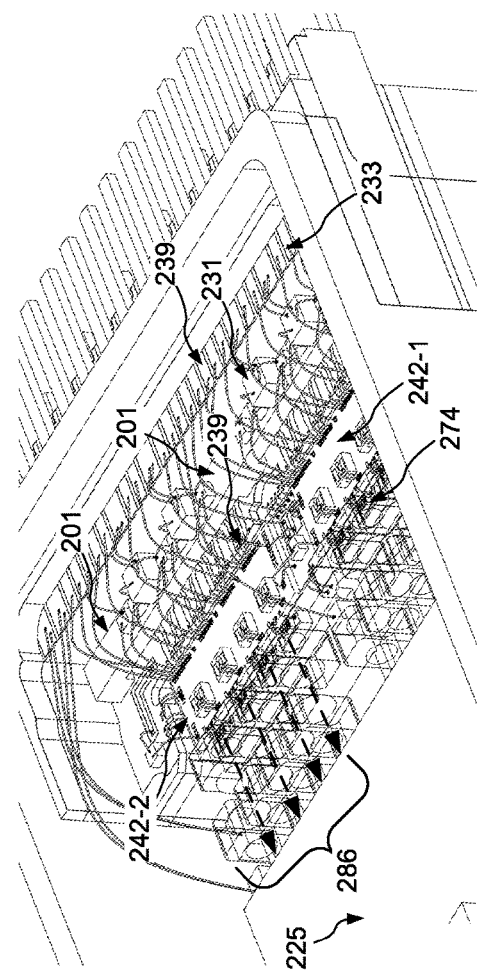
FIG. 4B shows an enlarged view of the TOSA module of FIG. 4A, in accordance with an embodiment.
Figure 4C:
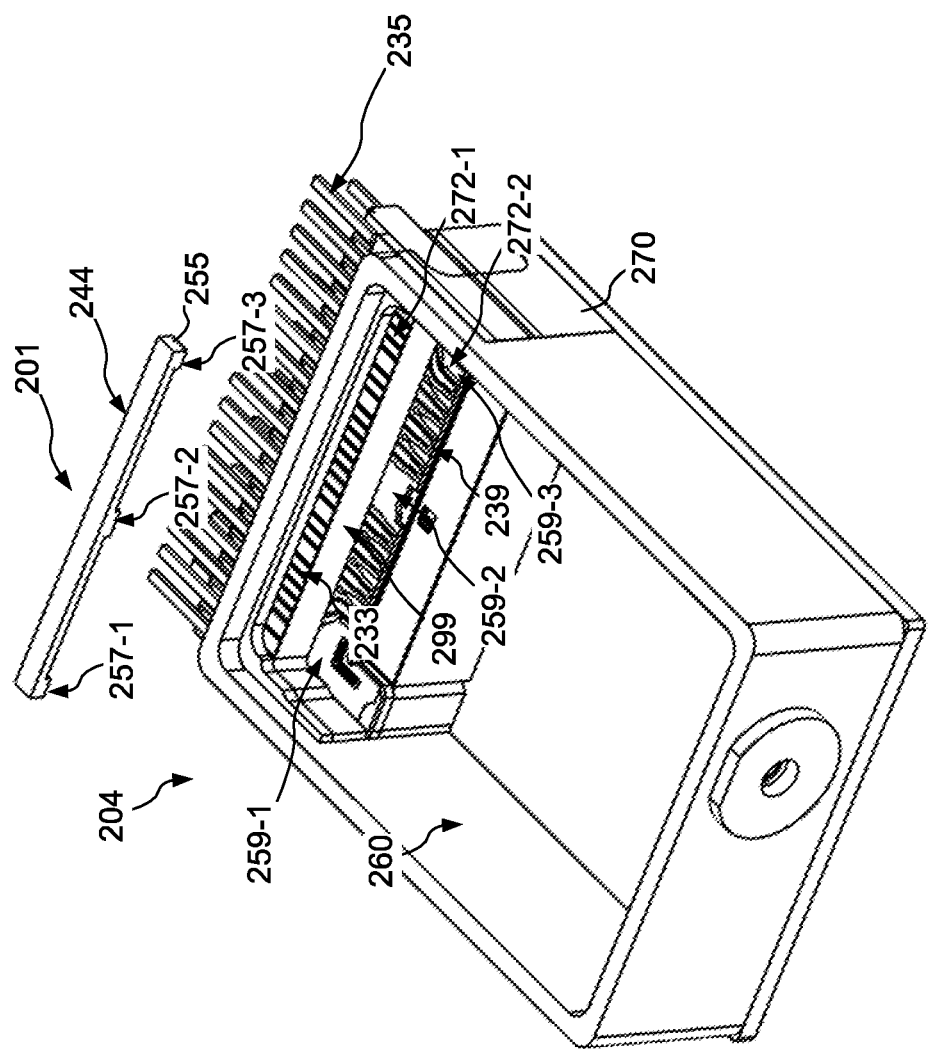
FIG. 4C shows a partially-exploded view of the TOSA module of FIG. 4A, in accordance with an embodiment.

Turning specifically to FIGS. 4A-4C, the TOSA arrangement 204 is shown in isolation. As shown, the TOSA arrangement 204 includes a housing 209, which also may be referred to herein as a TOSA housing. The housing 209 is illustrated with a cover portion omitted merely for clarity.

As shown, the housing 209 includes a plurality of sidewalls 256-1 to 256-3 that define a cavity 260 therebetween. The plurality of sidewalls 256-1 to 256-3 extend from a first end 261 to a second end 263 along the longitudinal axis 250 (FIG. 2). However, the housing 209 may have other shapes and configurations and the provided example is not intended to be limiting.

As further shown the TOSA arrangement 204 includes a feedthrough device 270, a plurality of laser arrangements 274, a multiplexing device 225, an optical isolator chip 276, and an output port 279. The feedthrough device 270 is disposed proximate the first end 261 of the housing 209 and extends at least partially into the cavity 260. In particular, a first portion 232-1 of the feedthrough device 270 extends at least partially into the cavity 260 and a second portion 232-2 may extend from the cavity 260 towards the substrate 202 for coupling purposes. Accordingly, the feedthrough device 270 defines at least a portion of the cavity 260.

The feedthrough device 270 may comprise, for example, a suitably rigid non-metal material such as inorganic material such as a crystalline oxide, nitride or carbide material, which may be commonly referred to as ceramic. Some elements, such as carbon or silicon, may also be considered ceramics, and are also within the scope of this disclosure.

Each laser arrangement of the plurality of laser arrangements 274 includes a laser diode, a monitor photodiode, and a focus lens. Each laser arrangement also includes a corresponding LD driver (LDD) chip mounted to the feedthrough device 270. For example, as shown in the enlarged region of FIG. 4B, each of the laser arrangements 274 can include a laser diode that is disposed at a substantially uniform distance of D1 from an associated LDD chip, e.g., LDD chips 242-1, 242-2.

Following the plurality of laser arrangements 274, a multiplexing device 225 is disposed at a midpoint within the cavity 260. In particular, the multiplexing device 225 includes an input region facing the first end 261 of the housing 209, and more particularly the plurality of laser arrangements 274. The input region includes a plurality of input ports (not shown) that are aligned to receive channel wavelengths from LDs along an associated light path. Each of the laser arrangements 274 may then emit associated channel wavelengths on a corresponding light path of a plurality of input light paths 286 that intersect with the input region. Each light path of the plurality of light paths 286 therefore extends from an emission surface of an associated LD through a focus lenses, and then ultimately to the input region of the multiplexing device 225.

The multiplexing device 225 further includes an output port that is disposed opposite the input region such that the output port faces the second end of the housing 209. The output port outputs a multiplexed signal along an output light path. An optical isolator chip 276 proximate the second end 263 of the housing 209 includes an aperture, by which the output light path extends therethrough. Following the optical isolator chip 276, the housing 209 includes an opening/aperture for coupling to an optical coupling receptacle 292. Accordingly, the multiplexing device 225 outputs a multiplexed optical signal for transmission by way of the output light path, optical isolator chip 276 and optical coupling receptacle 292.

As more clearly shown in FIG. 4C, the feedthrough device 270 may be defined by at least a first mounting surface 272-1 and a second mounting surface 272-2. Although denoted as "first" and "second," these designations are merely for purposes of clarity and are utilized simply to distinguish between the mounting surfaces 272-1, 272-2. To this end, either mounting surface may be referred to as a "first" or "second" surface.

In any event, the first and second mounting surfaces 272-1, 272-2 may be formed integrally with the feedthrough device 270 as a single piece, e.g., allowing for direct coupling of components to the feedthrough device 270. However, in some cases the first and second mounting surfaces 272-1, 272-2 may be provided by one or more submounts. In either case, the feedthrough device 270 advantageously provides mounting regions that facilitate such direct or indirect mounting and support of components.

Continuing on, the first and second mounting surfaces 272-1, 272-2 may be substantially planar, such as shown, although the first and second mounting surfaces 272-1, 272-2 are not limited in this respect and other embodiments are within the scope of this disclosure. The first and second mounting surfaces 272-1, 272-1 extend substantially in parallel relative to each other but are offset by a distance D to provide a step structure or profile. To this end, the arrangement of the first and second mounting surfaces 272-1, 272-2 may collectively provide a "stepped," or multi-step mounting profile whereby the first and second mounting surfaces are adjoined by a sidewall 299 (See FIG. 4C) that extends substantially transverse to each and provides the offset distance D. The offset distance D may measure between 10 and 130 microns, and preferably 100 microns although other distances are within the scope of this disclosure.

The first mounting surface 272-1 may be substantially coplanar with the first mounting surface 245 of the substrate 202, or not, depending on a desired configuration. This may advantageously allow for electrical traces 233 disposed/patterned on the first mounting surface 272-1, and more specifically an electrical trace region, to electrically couple with the substrate 202 via an interconnect device such as the bus bars 235. Power and RF signals may be then provided to the TOSA arrangement, and more particularly, optical components disposed within the cavity 260 of the housing 209.

Accordingly, the first mounting surface 272-1 may also be referred to as a feedthrough mounting surface as at least a conductive portion of the same, e.g., the conductive traces patterned thereon, extends out from the cavity 260 of the housing 209.

On the other hand, the second mounting surface 272-2 is disposed within the cavity 260 of the housing 209 and is disposed at the offset distance from that of the first mounting surface 272-1. The second mounting surface 272-2 may be accurately referred to as an internal mounting surface or a recessed mounting surface whereby the second mounting surface 272-2 is fully within the cavity 260 of the housing 209 and disposed below the first mounting surface 272-1.

As discussed below, the second mounting surface 272-2 includes a plurality of filtering capacitors 231 mounted thereon via a component bridge 201 (See FIG. 4B). The filtering capacitors 231 may be utilized when driving the plurality of laser arrangements to maintain signal integrity, e.g., by reducing noise, stabilizing the DC signal, for example.

The first and second LDD chips 242-1, 242-2 can electrically couple to the plurality filtering capacitors 231 via wire bonds, for instance, although other types of interconnects are within the scope of this disclosure. In addition, the plurality of laser arrangements 274 electrically couple to the electrical traces 239 of the second mounting surface 272-2. The electrical traces 239 then couple to the traces 233 of the first mounting surface 272-1, and ultimately circuitry of the substrate 202, to complete an electrical circuit for RF and power signals.

As shown more clearly in the partially-exploded TOSA arrangement 204 of FIG. 4C, the component bridge 201 includes a body 255. The body 255 comprises a conductive material such as Cu-W or other suitable metal/metal alloy such as copper. The body 255 can be formed as a single, monolithic piece or from multiple pieces. The body 255 includes a plurality of projections, namely projections 257-1 to 257-3, which may also be referred to as legs or feet. The projections 257-1 to 257-3 each extend substantially transverse relative a longitudinal axis of the body 255. The body 255 provides a notched profile based on the plurality of projections. The notched profile allows the body 255 to be mounted to the second mounting surface 272-2 while remaining electrically isolated from the trace region of the same.

Thus, the notched profile of the body 255 provides functionally an accommodation groove to allow for electrical traces 239 to at least partially pass therethrough without electrically shorting on the body 255. The accommodation groove therefore extends between adjacent projections of the plurality of projections 257-1 to 257-3.

The embodiment shown in FIG. 4C includes first and third projections 257-1, 257-3 disposed adjacent opposite ends of the body 255, and a second projection 257-2 disposed at a midpoint of the body 255. This arrangement results in two accommodation grooves being formed. However, N number of notches may be formed depending on a desired configuration, and this disclosure is not limited in this regard.

The body 255 further defines a component mounting surface 244 to couple to at least one electrical component, such as filtering capacitors 231. The component mounting surface 244 can be substantially planar, such as shown, although other configurations are within the scope of this disclosure.

The component bridge 201 can be disposed on the second mounting surface 272-2 to electrically couple to the same. As shown in FIG. 4B, the component bridge 201 may be disposed with the body 255 extending substantially transverse relative to the longitudinal axis 250 (See FIG. 2). Further, the body 255 can abut adjoining sidewall 299 to ensure proper alignment and positioning during manufacturing.

Each of the projections 257-1 to 257-3 can be mounted on pads 259-1 to 259-3, respectively. The pads 259-1 to 259-3 may be formed of an electrically conductive material, e.g., copper, and electrically connect the projections 257-1 to 257-3 with a ground connection or power rail, depending on a desired configuration. Thus, electrical components coupled to and supported by component mounting surface 244 may electrically couple with the ground/power rail by way of the body 255 and projections 257-1 to 257-3.

The component bridge 201 couples to the second mounting surface 272-2 via an adhesive or other suitable fixation approach. The adhesive may be disposed on pads 259-1 to 259-3, followed by placement of the component bridge 201 in a manner that causes each of the projections 257-1 to 257-3 to engage the pads 259-1 to 259-3, respectively. The adhesive may then be cured via, for instance, ultraviolet (UV) light, to securely/fixedly couple the component bridge 201 to the second mounting surface 272-2 of the feedthrough device 270.

In operation, the multi-channel TOSA arrangement 204 receives an RF driving signal and power from the substrate 202. In particular, the optical components such as the plurality of laser arrangements 274 receive the RF driving signal and power via the traces 233, 239. In response, the plurality of laser arrangements 274 then modulate and launch channel wavelengths based on the received RF driving signal. The channel wavelengths are then received at the input region of the multiplexing device 225. The multiplexing device 225 then multiplexes the received channel wavelengths and outputs a multiplexed signal to the transmit optical coupling receptacle.

In accordance with an aspect of the present disclosure a transmitter optical subassembly (TOSA) arrangement is disclosed. The TOSA arrangement comprising a housing having a plurality of sidewalls that define a cavity therebetween, a feedthrough device having a first end disposed in the cavity of the housing and a second end extending from the cavity away from the housing, the feedthrough device providing at least a first mounting surface proximate the first end within the cavity, a trace region disposed on the first mounting surface, a component bridge coupled on the first mounting surface, the component bridge having a body with a component mounting surface to couple to an electrical component and at least one notch to provide an accommodation groove to electrically isolate the body from the trace region of the first mounting surface, and a plurality of radio frequency (RF) traces disposed on the trace region and extending at least partially through the accommodation groove, the plurality of RF traces electrically isolated from the body of the component bridge based on the at least one notch.

In accordance with another aspect of the present disclosure a multi-channel transceiver module is disclosed. The multi-channel transceiver module comprising a substrate having at least a first mounting surface for coupling to optical components, a multi-channel transmitter optical subassembly (TOSA) arrangement electrically coupled to the substrate, the multi-channel TOSA arrangement comprising a housing having a plurality of sidewalls that define a cavity therebetween, a feedthrough device having a first end disposed in the cavity of the housing and a second end extending from the cavity away from the housing, the feedthrough device providing at least a first mounting surface proximate the first end within the cavity, a trace region disposed on the first mounting surface, a component bridge coupled on the first mounting surface, the component bridge having a body with a component mounting surface to couple to an electrical component and at least one notch to provide an accommodation groove to electrically isolate the body from the trace region of the first mounting surface, and a plurality of radio frequency (RF) traces disposed on the trace region and extending at least partially through the accommodation groove, the plurality of RF traces electrically isolated from the body of the component bridge based on the at least one notch, a receiver optical subassembly (ROSA) coupled to the substrate.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A transmitter optical subassembly (TOSA) arrangement, the TOSA arrangement comprising:
   a housing having a plurality of sidewalls that define a hermetically-sealed cavity therebetween;
   a feedthrough device having a first end disposed in the hermetically-sealed cavity of the housing and a second end extending from the hermetically-sealed cavity away from the housing, the feedthrough device providing at least a first mounting surface proximate the first end within the hermetically-sealed cavity;
   a trace region disposed on the first mounting surface;
   a component bridge coupled on the first mounting surface, the component bridge comprising a body formed as a single monolithic piece of an electrically conductive material, wherein the body formed as the single monolithic piece provides a component mounting surface to couple to an electrical component and wherein the body formed as the single monolithic piece includes feet that define at least one notch to provide an accommodation groove to electrically isolate the body from the trace region of the first mounting surface;
   an electrical component mounted to the body of the component bridge via the component mounting surface and wherein the electrical component is electrically coupled to a voltage signal via the feet of the body formed as the single monolithic piece; and
   a plurality of radio frequency (RF) traces disposed on the trace region and extending at least partially through the accommodation groove, the plurality of RF traces electrically isolated from the body of the component bridge based on the at least one notch.

2. The TOSA arrangement of claim 1, wherein the component bridge comprises copper.

3. The TOSA arrangement of claim 1, wherein at least one of the feet has a mating surface for coupling to a pad of the first mounting surface adjacent the trace region.

4. The TOSA arrangement of claim 3, wherein the component mounting surface of the component bridge electrically couples to the pad by way of the at least one of the feet.

5. The TOSA arrangement of claim 3, wherein the electrical component is a filtering capacitor, and wherein the filtering capacitor electrically couples to the pad of the first mounting surface by way of the at least one of the feet and the component mounting surface.

6. The TOSA arrangement of claim 3, wherein the feet comprise at least a first and second feet disposed adjacent opposite ends of the body of the component bridge, and wherein the accommodation groove extends between the first and second feet.

7. The TOSA arrangement of claim 1, wherein the body of the component bridge abuts a sidewall of the feedthrough device, the sidewall extending substantially transverse from the first mounting surface of the feedthrough device.

8. The TOSA arrangement of claim 1, wherein the at least one notch of the body of the component bridge comprises first and second notches, the first and second notches being both defined at least in part by a projection extending from a midpoint of the body of the component bridge.

9. The TOSA arrangement of claim 8, wherein the projection is electrically conductive and electrically couples the component mounting surface to a pad of the first mounting surface of the feedthrough device.

10. A multi-channel transceiver module, the multi-channel transceiver module comprising:
- a substrate having at least a first mounting surface for coupling to optical components;
- a multi-channel transmitter optical subassembly (TOSA) arrangement electrically coupled to the substrate, the multi-channel TOSA arrangement comprising:
  - a housing having a plurality of sidewalls that define a hermetically-sealed cavity therebetween;
  - a feedthrough device having a first end disposed in the hermetically-sealed cavity of the housing and a second end extending from the hermetically-sealed cavity away from the housing, the feedthrough device providing at least a first mounting surface proximate the first end within the hermetically-sealed cavity;
  - a trace region disposed on the first mounting surface;
  - a component bridge coupled on the first mounting surface, the component bridge comprising a body formed as a single monolithic piece of an electrically conductive material, wherein the body formed as the single monolithic piece provides a component mounting surface to couple to an electrical component and wherein the body formed as the single monolithic piece includes feet that define at least one notch to provide an accommodation groove to electrically isolate the body from the trace region of the first mounting surface;
  - an electrical component mounted to the component bridge via the component mounting surface and wherein the electrical component is electrically coupled to a voltage signal via the feet of the body formed as the single monolithic piece; and
  - a plurality of radio frequency (RF) traces disposed on the trace region and extending at least partially through the accommodation groove, the plurality of RF traces electrically isolated from the body of the component bridge based on the at least one notch;
- a receiver optical subassembly (ROSA) coupled to the substrate.

11. The multi-channel transceiver module of claim 10, wherein the component bridge comprises copper.

12. The multi-channel transceiver module of claim 10, wherein at least one of the feet has a mating surface for coupling to a pad of the first mounting surface adjacent the trace region.

13. The multi-channel transceiver module of claim 12, wherein the component mounting surface of the component bridge electrically couples to the pad by way of the at least one of the feet.

14. The multi-channel transceiver module of claim 12, wherein the at least one electrical component is a filtering capacitor, and wherein the filtering capacitor electrically couples to the pad of the first mounting surface by way of the at least one of the feet and the component mounting surface.

15. The TOSA arrangement of claim 1, wherein the feedthrough device comprises ceramic.

* * * * *